United States Patent
Kamata

(10) Patent No.: US 6,696,845 B2
(45) Date of Patent: Feb. 24, 2004

(54) NOISE EVALUATION CIRCUIT FOR IC TESTER

(75) Inventor: Masayuki Kamata, Yokohama (JP)

(73) Assignee: Ando Electric Co., Ltd. (Japanese), Tokyo (JP)

( * ) Notice: Subject to any disclaimer, the term of this patent is extended or adjusted under 35 U.S.C. 154(b) by 40 days.

(21) Appl. No.: 10/205,726

(22) Filed: Jul. 25, 2002

(65) Prior Publication Data

US 2003/0020498 A1 Jan. 30, 2003

(30) Foreign Application Priority Data

Jul. 27, 2001 (JP) ........................................ 2001-228562

(51) Int. Cl.[7] .............................................. G01R 31/26
(52) U.S. Cl. ...................................... 324/719; 324/158.1
(58) Field of Search ................................ 324/719, 158.1

(56) References Cited

U.S. PATENT DOCUMENTS 5,668,507 A * 9/1997 Boerstler et al. .............. 331/78
6,269,328 B1 * 7/2001 Hirano ......................... 703/28
2002/0017912 A1 * 2/2002 Tamaki et al. ............... 324/750

FOREIGN PATENT DOCUMENTS

| EP | 135869 A | * 4/1985 | ........... G01R/31/28 |
| JP | 07294594 A | * 11/1995 | ........... G01R/31/26 |

* cited by examiner

Primary Examiner—Charles H. Nolan, Jr.
(74) Attorney, Agent, or Firm—Darby & Darby

(57) ABSTRACT

In order to provide an IC tester which can measure noise measuring performance in a position where a DUT to be analyzed on an evaluation board is mounted quantitatively, a noise evaluation circuit comprises a reference resistor which generates thermal noise, a reference noise generator a summing circuit, an amplifying circuit which amplifies result of the calculation in the summing circuit, a switch, and an evaluation board having the reference resistor, the reference noise generator, the summing circuit, the amplifying circuit, and the switch thereon for evaluating the DUT to be evaluated. Two kinds of electricity value which is output by the amplifying circuit by an on/off operation of the switch are calculated with noise figure F according to three kinds of electricity value including electricity value such as the reference noise electricity.

8 Claims, 4 Drawing Sheets

NOISE EVALUATION CIRCUIT FOR IC TESTER

BACKGROUND OF THE INVENTION

1. Field of the Invention

The present invention relates to a method for a circuit for evaluating signal versus noise level as an evaluating reference in an evaluating apparatus such as an IC tester for evaluating electric performance of an IC (Integral Circuit). Particularly, the present invention relates to a noise evaluation circuit for an IC tester such as a mixed signal tester for analyzing an integral circuit in which an analog circuit and a digital circuit exist together therein.

2. Description of Related Art

Recently, an IC (Integral Circuit) is used in various aspects, and an IC is used for analyzing electrical and operating characteristics and a root cause of failure of an IC.

FIG. 5 is a view for explaining a theory of an analyzing an apparatus such as an IC tester for a semiconductor integrated circuit (IC).

An entire IC tester comprises a section in which a measuring circuit 14 such as a test head 12 is mounted, a section in which a processing circuit 15 such as an IC tester unit 11 for performing a processing of analysis result in a test for a device under test (hereinafter called "DUT") 17 to be analyzed, and a computer 13 for controlling an entire IC tester.

A DUT 17 to be analyzed is mounted on an evaluation board 16 in the above-mentioned IC tester, and electric and operating characteristics are analyzed by an measuring circuit 14.

It is necessary to understand noise analysis performance of an IC tester in analyzing a DUT 17 to be analyzed on an evaluation board 16 in a mounted position in advance so as to analyze signal versus noise level characteristics of an IC.

In particular, it is important to analyze signal versus noise level characteristics in analyzing a DUT having a circuit in which a digital circuit and an analog circuit such as an A/D (analog/digital) convertor and a D/A (digital/analog) converter exist together.

However, in a conventional IC tester, there has been a problem in that it is not possible to analyze signal versus noise level characteristics accurately because it is not possible to measure noise measuring performance (noise figure F) of an IC tester quantitatively in a mounted position of a DUT 17 to be analyzed on an evaluation board 16.

SUMMARY OF THE INVENTION

The present invention is made in consideration of the above problem. An object of the present invention is to provide a noise evaluating circuit for an IC tester in which noise analysis characteristics for a DUT 17 in a mounted position on an evaluation board 16 can be measured quantitatively.

A first aspect of a noise evaluation circuit for an IC tester according to the present invention is characterized in evaluating the noise level of an IC tester which analyzes electrical and operating characteristics of a DUT such as an IC to be analyzed. A noise evaluation circuit for an IC tester according to the present invention comprises mounts a reference resistor which generates thermal noise (for example, a reference resistor 1), a reference noise generator which generates reference noise electricity which is calibrated (for example, a reference noise generating circuit 2), a summing circuit which adds the electricity of the thermal noise to the reference noise electricity (for example, switches 120 to 122), an amplifying circuit which amplifies result of the calculation in the summing circuit (for example, an amplifier 3), and a switch which is disposed between the reference noise generator and the summing circuit, on an evaluation board which evaluates and element to be analyzed. A noise evaluation circuit for an IC tester according to the present invention determines noise figure F according to three electricity values such as two kinds of electrical value which are output from the above-mentioned amplifying circuit by switching on and off and electrical value of the reference noise electricity.

A second aspect of a noise evaluation circuit for an IC tester according to the present invention is characterized in that a summing circuit outputs sum of noise electricity and electricity of thermal noise to an amplifying circuit when a switch is in an on-state and outputs an electrical value of only electricity of thermal noise to the amplifying circuit when the switch is an in off-state.

A third aspect of a noise evaluation circuit for an IC tester according to the present invention is characterized in that amplification ratio of an amplifying circuit is determined by an amplified value of summed result of reference noise electricity which is output from an amplifying circuit when a switch is in an on-state and electricity of a thermal noise and an amplified value of only electricity of the thermal noise which is output from the amplifying circuit when the switch is in an off-state, and calculates noise figure F according to the amplification ratio and the reference noise electricity.

A fourth aspect of a noise evaluation circuit for an IC tester according to the present invention is characterized in that a reference noise generator comprises a resistor and a plurality of amplifiers which amplify thermal noise of the resistor.

A fifth aspect of a noise evaluation circuit for an IC tester according to the present invention is characterized in that a switch comprises a plurality of switch and outputs output from a plurality of amplifier via each resistor.

A sixth aspect of a noise evaluation circuit for an IC tester according to the present invention is characterized in that a summing circuit comprises a WiredOR.

A seventh aspect of a noise evaluation circuit for an IC tester according to the present invention is characterized in that a reference resistor is disposed near a DUT to be evaluated.

A eighth aspect of a noise evaluation circuit for an IC tester according to the present invention is characterized in that an amplifying circuit is disposed near a reference resistor.

According to the present invention, by mounting a noise evaluation circuit on an evaluation board and calibrating a noise evaluation circuit on an evaluation board in advance, it is possible to measure noise figure F without receiving influence of accuracy of calibrated value from a measuring circuit of an IC tester.

DETAILED DESCRIPTION OF THE INVENTION

Figure 5:
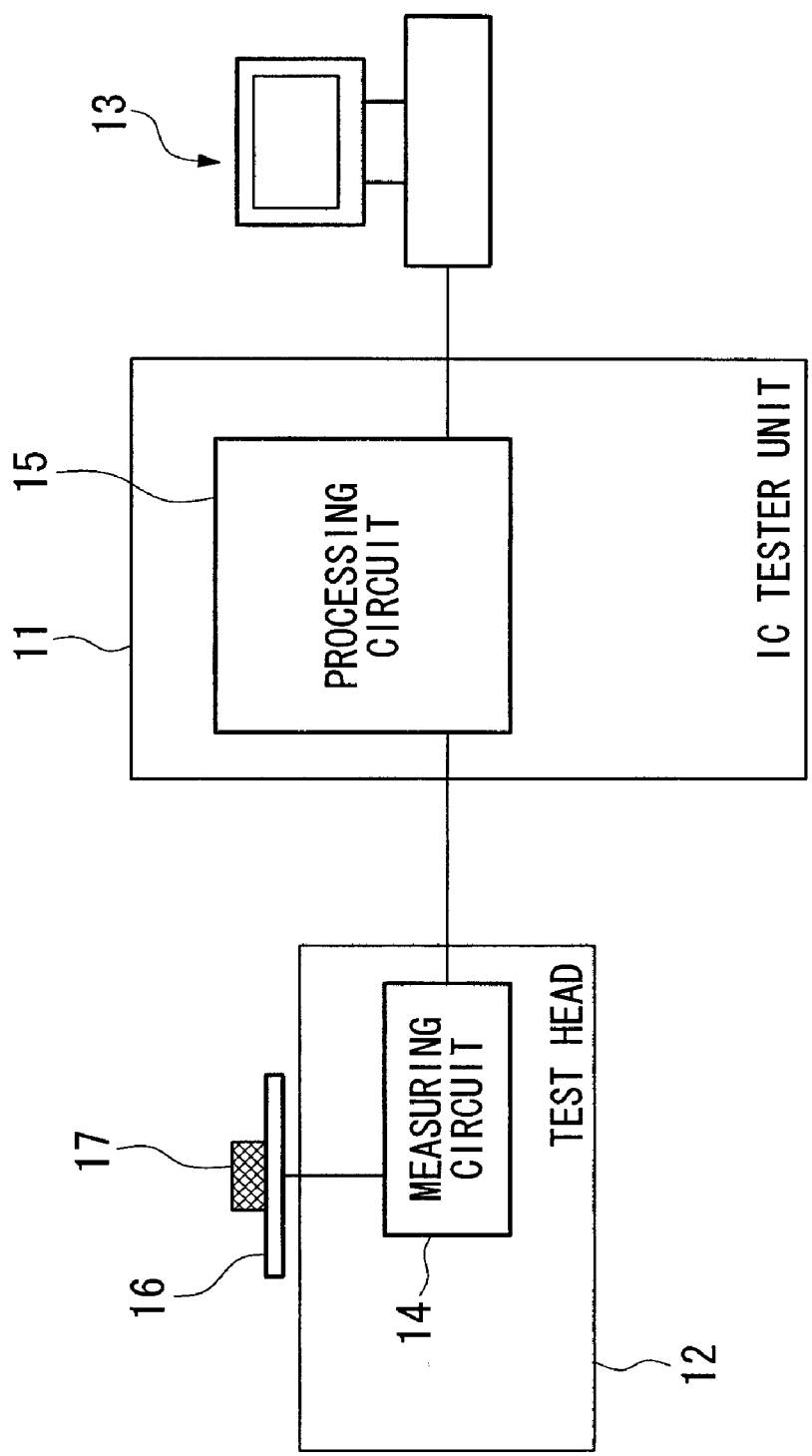
FIG. 5 is a view showing a schematic of an IC tester.

Embodiments of the present invention are explained as follows with reference to the drawings. The structure of an IC tester is the same as shown in FIG. 5. Also, in a noise evaluation circuit of an IC tester according to the present invention, resistance value of a resistor and amplification ratio of an amplifier are only examples. These values are not limited to what are disclosed in this specification.

Figure 1:
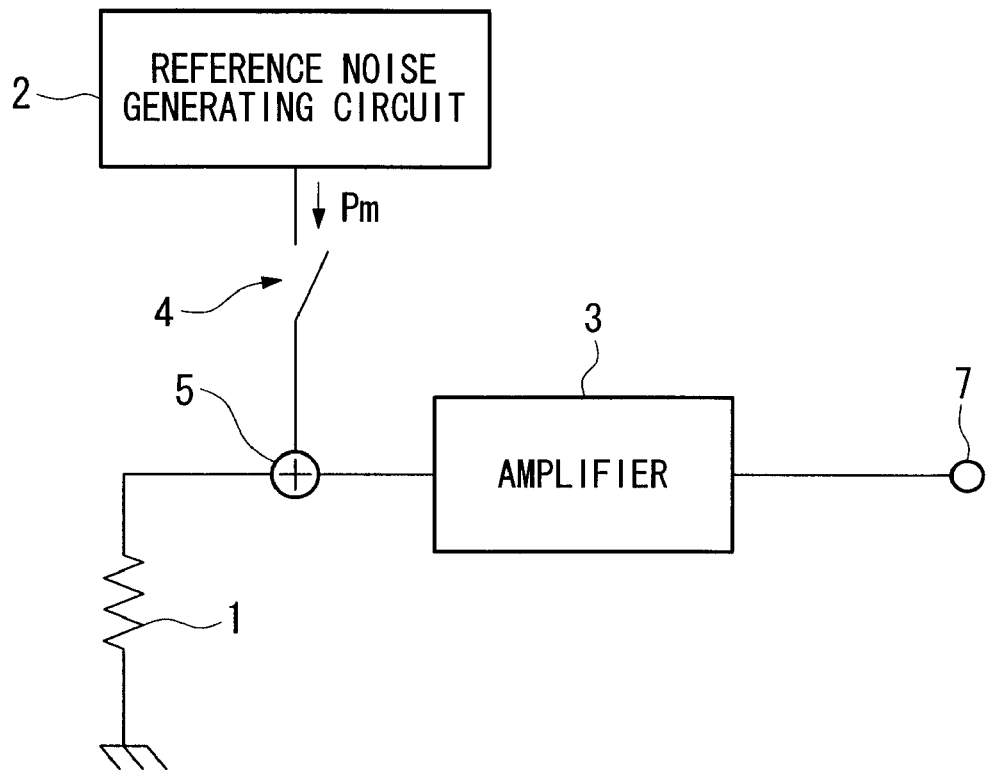
FIG. 1 is a view showing a schematics of a noise evaluation circuit in an IC tester in an embodiment according to the present invention.

However, on an evaluation board 16 (to be referred to FIG. 5) of an IC tester according to the present invention, a noise evaluation circuit shown in FIG. 1 is mounted.

FIG. 1 is a block diagram showing a noise evaluation circuit in an IC tester according to a first embodiment of the present invention.

In FIG. 1, an end of a reference resistor 1 (having resistance value for example 50Ω) is grounded. A reference resistor 1 is mounted in a position which a DUT 17 to be analyzed on an evaluation board 16 shown in FIG. 5 is mounted thereto.

That is, in signal processing technology, a general standard for measuring noise is to measuring a summed result of thermal noise and reference noise calculated by an amplification circuit by a thermal noise figure F according to thermal noise which is output from a resistor having the same resistor (50Ω) as an impedance of signal system.

A reference noise generator 2 supplies calibrated reference noise electricity from a reference noise generator (which is not shown in the drawing) to an input terminal of a summing circuit 5 via a switch 4.

A summing circuit 5 adds reference noise electricity which is input to an input terminal and electricity of thermal noise which is input to the other terminal from other terminal of a reference resistor 1, and outputs the summed result to an input terminal of an amplifier 3.

An amplifier 3 amplifies voltage and electricity of summed result of thermal noise which is generated by the above-mentioned reference resistor 1 and reference noise electricity from the above-mentioned noise generator to a necessary intensity for a measuring circuit 14 to measure its voltage and electricity. Amplified measurement signal is output to a controlling computer 13 from an output terminal via a pogo pin or a connector, a measuring circuit 14 and a processing circuit 15.

Also, an amplifier 3 is mounted near a reference resistor 2 so as to avoid influence of noise generated by other elements and wiring.

Next, a measuring theory for measuring signal versus noise level property by a noise evaluation circuit in an embodiment according to the present invention is explained. In an electronic measuring apparatuses such as an IC tester, noise figure such as F value is used for evaluating its fine signal measuring performance (signal versus noise level property).

Figure 2:
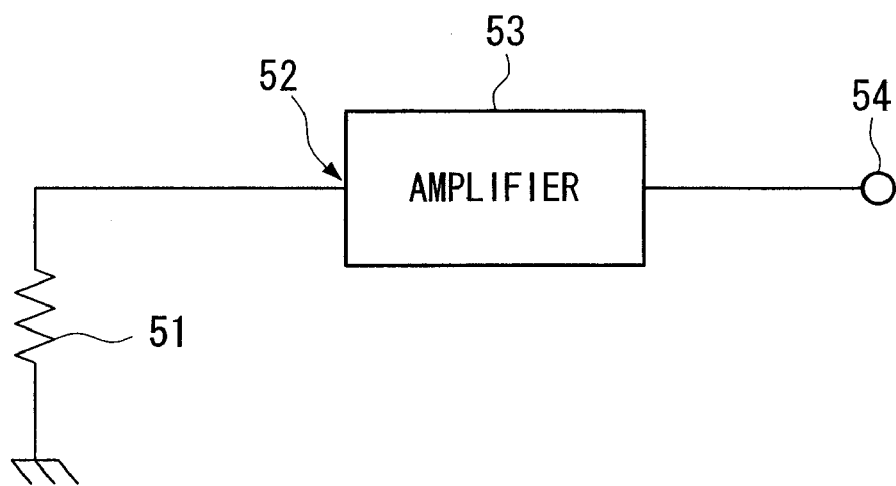
FIG. 2 is a view showing a schematic of measuring thermal noise from which noise figure F is determined.

In a structure based on a schematic diagram for measuring thermal noise as shown in FIG. 2, noise figure F value is defined as following Formula 1.

$$F = No/(k \cdot T \cdot B \cdot G) \qquad \text{Formula 1}$$

Here, each constant in Formula 1, "F" indicates noise figure. "No" indicates output noise electricity (Watts) as output electricity of an output terminal 54. "k" indicates Boltzmann's constant ($1.38 \times 10^{-23}$). "T" indicates absolute temperature (K). "B" indicates frequency bandwidth (Hz) of an amplifier 53. "G" indicates electricity gain of an amplifier 53.

According to such structure, in above-mentioned Formula 1, the calculation result of "k·T·B·G" becomes output noise electricity (Watts) which is output to an output terminal 54 after thermal noise electricity kTB which is generated by a reference resistor 51 which is connected to an input terminal 52 is amplified by an amplifier 53. Noise figure F is a ratio of output noise electricity and noise electricity No per a unit bandwidth in an output terminal of an apparatus.

Next, in FIG. 1, when a summing circuit 5 adds calibrated reference noise electricity Pn and thermal noise of a reference resistor 1, noise figure F at that time is determined by the following formulae.

At first, amplification ratio G of an amplifier 43 is determined by a following Formula 2.

$$G = (nP - P)/Pn \qquad \text{Formula 2}$$

In the Formula 2, "Pn" indicates calibrated noise electricity (Watts) which is added from a reference noise generating circuit 2 to a summing circuit 5 when a switch 4 is closed (switch 4 is in on-state). "P" indicates output electricity (Watt) of an output terminal 7 when a switch 4 is opened (switch 4 is in off-state). "nP" indicates output electricity (Watt) of an output terminal 7 when a switch 4 is closed (switch 4 is in an on-state). "n" indicates a ratio value of "P" and "nP".

Also, noise figure F is calculated by three kinds of electricity such as "Pn" as calibrated noise electricity which is added from a reference noise generating circuit 2 to a summing circuit 5 when a switch 4 is in an on-state, "P" as output electricity of an output terminal 7 when switch 4 is in an off-state, and "nP" as output electricity of an output terminal 7 when a switch 4 is in an on-state.

That is, a summing circuit 5 outputs sum of reference noise electricity Pn and noise electricity of thermal noise to an amplifying circuit 3 when a switch is in an on-state and outputs electricity value of only noise electricity of thermal noise to the amplifying circuit 3 when the switch is in an off-state.

A controlling computer 13 substitutes amplification ratio G which is calculated by Formula 2 for a Formula 1 according to three kinds of electricity such as two kinds of electricity value such as noise electricity nP, P which are output by an amplifier 3 which are obtained by switching on and off electricity value of reference noise electricity so as to generate a Formula 3 which is mentioned below. A controlling computer 13 calculates noise figure F according to a Formula 3.

Next, noise figure F is calculated by using a value of amplification ratio G which is determined by a Formula 2. When a Formula 2 is substituted for a Formula 1, noise figure F is determined as follows.

$$F = Pn/((n-1) \cdot k \cdot T \cdot B) \qquad \text{Formula 3}$$

When a formula 2 is substituted for a Formula 2, "nP−P" is equivalent to "P(n−1)", and a relationship such as No=P is effective.

A controlling computer 13 shown in FIG. 1 calculates noise figure F according to measurement signal (electricity value of noise electricity) which is input via a measurement circuit 14 and a processing circuit 15.

By doing this, even though measurement accuracy of a measurement circuit 14 shown in FIG. 1, a processing circuit 15, a controlling computer 13 which are connected to an amplifier 3 on an evaluating board 16 (to be referred to FIG. 1) and an output terminal are not calibrated, it is possible to determine noise figure F which depends only on calibration accuracy of reference noise electricity Pn by calibrating a value of noise Pn which is generated by a reference noise generating circuit 2 in FIG. 1 in advance and determining measurement result (nP and P in Formulae 2 and 3) of noise electricity which is displayed on a controlling computer 13.

That is, a controlling computer 13 determines amplification ratio of summed result of reference noise electricity Pn which is output from an amplifier 3 and noise electricity of the above-mentioned thermal noise when a switch 4 is in an on-state and determines amplification ratio G of an amplifier 3 according to amplification ratio of only noise electricity of thermal noise which is output from an amplifier 3 when a switch 4 is in an off-state. Noise figure F is determined by executing a Formula 3 according to the amplification ratio G and reference noise electricity Pn.

Next, applied use of a tester of noise evaluation circuit is explained with reference to FIGS. 1 and 3.

Figure 3:
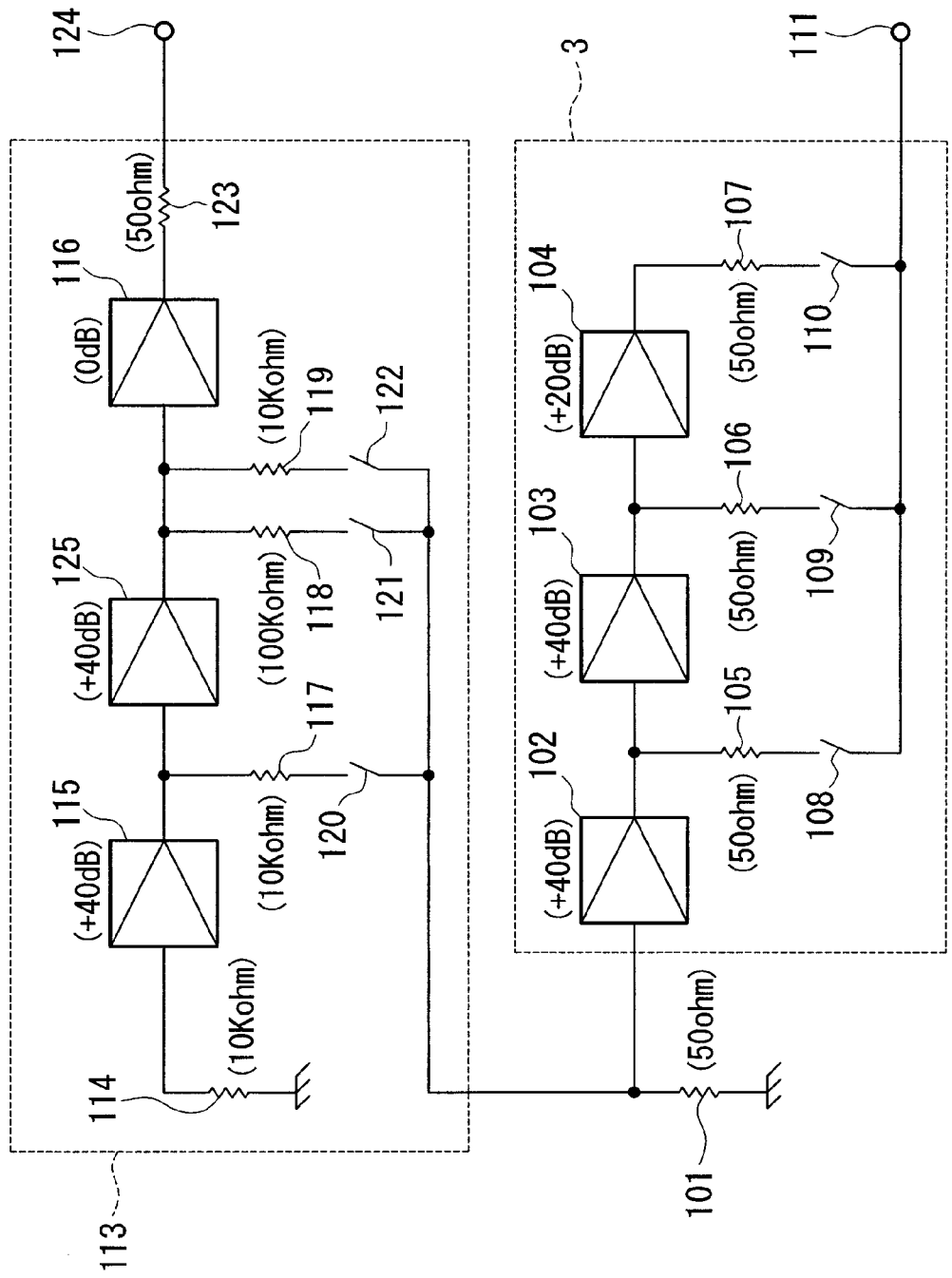
FIG. 3 is a block diagram showing an example of a noise evaluation circuit shown in FIG. 1.
Figure 4:
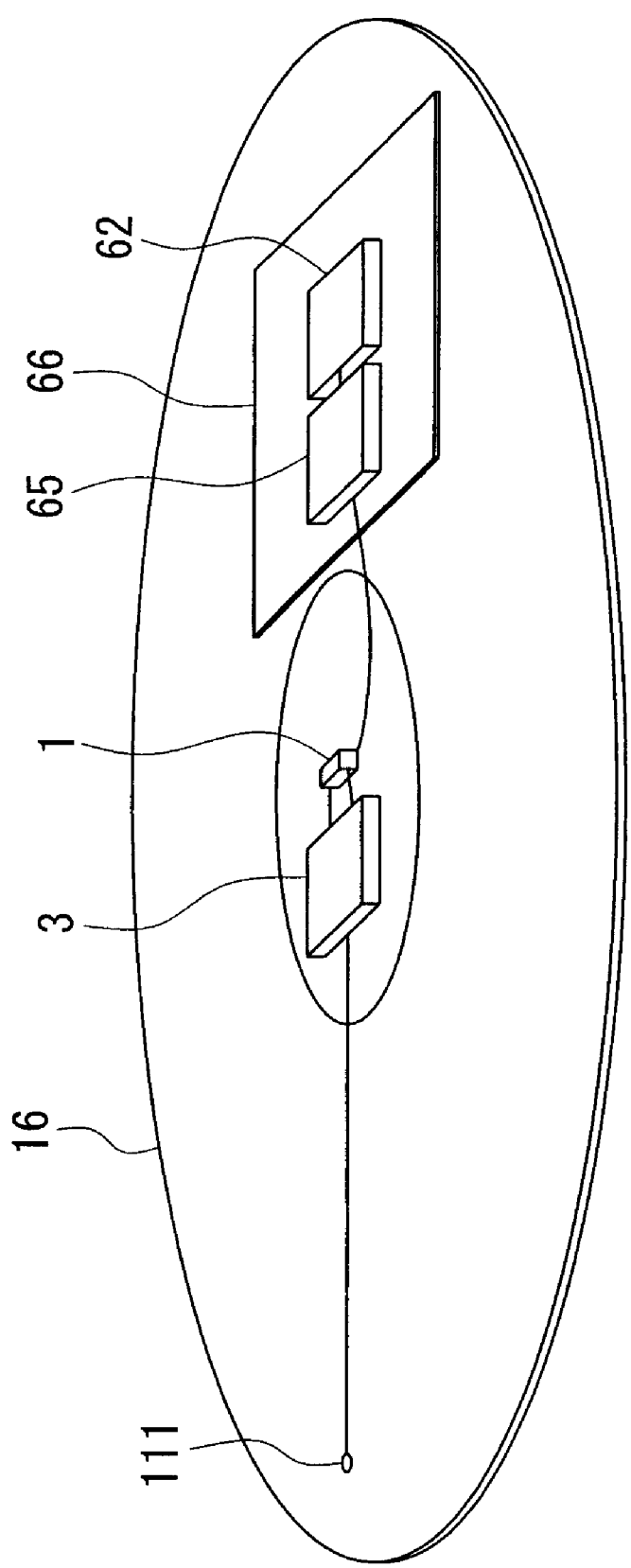
FIG. 4 is a view showing an example in which a noise evaluation circuit is mounted on an evaluation board 16.

FIG. 3 is a diagram for showing a shcematic of a noise evaluation circuit which is mounted on an evaluation board 16 shown in FIGS. 4 and 5.

In FIG. 3, amplifiers 102 and 103 having amplifying characteristics such as amplification ratio+40 dB is connected to a reference resistor 101 having 50Ω of resistor (which corresponds to a reference resistor 1 shown in FIG. 1).

An output of an amplifier 103 is connected to an amplifier 104 having amplifying characteristics such as amplification ratio+20 dB.

Amplifiers 102, 103, and 104 can be realized as a negative feedback amplifier easily by using a low noise operational amplifier which is obtainable currently as shown in FIG. 3.

An amplifier 3 of FIG. 1 comprises amplifying units 102 to 104, resistors 105 to 107, and switches 108 to 110.

An output terminal 111 on an evaluation board 16 is connected to each output terminal of 102, 103, and 104 of amplifying units via switches 108, 109, and 110 and via resistors 105, 106, and 107.

Here, resistors 105, 106, and 107 rectify impedance.

According to controlling operation by a controlling computer 13 via a measuring circuit 14, by closing either one of switches 108, 109, and 110 (so as to be on-state), amplification ratio of an amplifier 3 which is connected to a reference resistor 101 can be set to either value of +40 dB, +60 dB, or +100 dB.

Such a setting is changed according to noise level which is measured on a test head 12 of an IC tester.

A region which is indicated by a reference numeral 113 in upper section of FIG. 3 indicates a circuit which comprises a reference noise generating circuit (which corresponds to a reference noise generating circuit 2 in FIG. 1) which is organized by an amplifier 115 (having 40 dB of amplification ratio), an amplifier 125 (having 40 dB of amplification ratio), an amplifier 116 (having 0 dB of amplification ratio) and resistors 117 to 119, and switches 120 to 122 (which correspond to a switch 4 in FIG. 1).

A circuit which is indicated by this region 113 is formed on a small printed circuit board which is mounted on an evaluation board 17.

Here, resistors 117 to 119 convert voltage to electric current.

Therefore, by connecting a resistor 117 (10 kΩ), a resistor 118 (100 kΩ), and a resistor 119 (10 kΩ) and switching these 3 resistors by a switch, it is possible to supply calibrated thermal noise electricity having electricity ratio 1/10/100 to a resistor 101 (50Ω) so as to perform summing operation.

By doing this, it is possible to add noise electricity of calibrated thermal noise to an input end of an amplifier 102.

On a small printed circuit board (a printed circuit board 66 shown in FIG. 4), a resistor 114 (for example, 10 kΩ) for generating reference noise is mounted. Amplifiers 115 and 125 are connected in series to a resistor 114. Noise electricity of thermal noise which is generated by a resistor 114 for generating reference noise is amplified, and amplified noise electricity is output to an amplifying unit 102 of an amplifier 3 via a resistor 120, 118, and 119.

By doing this, noise electricity from switches 120 to 122 and noise electricity of thermal noise which is generated by a reference resistor 101 are summed and input to an input terminal of an amplifying unit 102.

An amplifier 116 is an amplifier made of a transistor for amplifying electricity having 0 dB of amplification ratio.

Also, an output of an amplifier 116 is connected to a terminal 124 via a resistor 123 for rectifying impedance having resistor of 50Ω.

Therefore, it is possible to calibrate output voltage of an amplifiers 115 and 125 by measuring output electricity of a terminal 124 by a calibrated power meter.

That is, it is possible to calibrate reference noise electricity Pn of a reference noise generating circuit 2 shown in FIG. 1.

Resistors 117 (10 kΩ), 118 (100 kΩ), and 119 (10 kΩ) have a function for converting voltage of output terminals of an amplifier 115 and an amplifier 125 to corresponding electricity according to resistance value. By selecting one of switches 120, 121, or 122 so as to be in on-state, it is possible to sum calibrated noise electricity (reference noise electricity Pn) and noise electricity of thermal noise which is generated by a reference resistor 101 so as to input to an input terminal of an amplifier 102.

That is, a resistor 101 shown in FIG. 3 corresponds to a reference resistor 1 shown in FIG. 1. Switches 120 to 122 shown in FIG. 3 correspond to a switch 4 shown in FIG. 1. Amplifying units 102 to 104 shown in FIG.3 correspond to an amplifier 3 shown in FIG. 1. A terminal 111 shown in FIG. 3 corresponds to a terminal 7 shown in FIG. 1.

In FIG. 3, a structure which corresponds to a summing circuit 5 shown in FIG. 1 is organized by a WiredOR.

An amplification circuit which comprises amplifying units 102 to 104, resistors 105 to 107 having 50Ω, and switches 108 to 110 corresponds to an amplifier 3 shown in FIG. 1.

Next, an operational example of an embodiment according to the present invention is explained with reference to FIGS. 1 and 3.

Here, for example, when noise figure F is measured, it is assumed that frequency bandwidth B is 100 KHz, and thermal noise voltage which is generated by a resistor 114 (10 kΩ) is 4.07 μV.

Thermal noise voltage of an output terminal of an amplifier 115 becomes 407 μV, and thermal noise voltage of an output terminal of an amplifier 125 becomes 40.7 mV.

In this case, electricity which flows when a switch 120 is in an on-state is 40.7 nA. Electricity which flows when a switch 121 is in an on-state is 407 nA. Electricity which flows when a switch 122 is in an on-state is 4.07 μA.

By doing this, following electricity values are summed to an input terminal of an amplifier 102. Electricity value of reference noise electricity Pn which is summed when a switch 120 is in an on-state is 0.0828 pW. Electricity value of reference noise electricity Pn which is summed when a switch 121 is in an on-state is 0.0828 pW. Electricity value of reference noise electricity Pn which is summed when a switch 122 is in an on-state is 0.0828 pW.

Each electricity value to be summed is equivalent to reference noise electricity Pn which is calibrated in Formulae 2 and 3. In both cases in that reference noise electricity Pn is summed to an input terminal of an amplifier 102 and reference noise electricity Pn is not summed thereto when any one of switches 108 to 110 is in an on-state or in an off-state, it is possible to measure noise voltage nP and P which are output to output terminal 111 by a measurement circuit 14 and determine noise figure F from Formulae 2 and 3 according to noise voltage nP and P as a measurement result.

In FIG. 4, actual disposition of each structure according to the present invention is shown in FIG. 4. A noise evaluation circuit shown in FIG. 3 is disposed on an evaluation board 16.

A reference noise generator 62 and a switching circuit 65 correspond to a region which is indicated by a reference numeral 113 in FIG. 3. A region 113 is mounted on a printed circuit board 66 which is attached on an upper surface of an evaluation board 16.

Here, a reference noise generator 62 corresponds to a structure which comprises a resistor 114, an amplifier 115, an amplifier 125, an amplifier 123 and resistors 117 to 119 shown in FIG. 3. That is, a reference noise generator 62 corresponds to a reference noise generating circuit 2 shown in FIG. 1.

Also, a switching circuit 65 corresponds to a structure which comprises switches 120 to 122 shown in FIG. 3. That is, a switching circuit 65 corresponds to a circuit which comprises a switch4 shown in FIG. 1.

Similarly, a summing circuit 5 shown in FIG. 1 is made from WiredOR as shown in FIG. 3.

An output terminal of a switching circuit 65 is connected to a reference resistor 1 on an evaluation board 16 via a wiring for summing noise electricity.

An amplifier 3 which is connected to a reference resistor 1 is connected to an output terminal 111 on an evaluation board 16.

Here, a reference resistor 1 and an amplifier 3 are disposed on a printed circuit board on an evaluation board 16. A printed circuit board is disposed near a printed circuit board 65 and a DUT to be analyzed such as an object of testing.

When measuring noise figure F, an output of an amplifier 3 is connected to a measuring circuit 14 in a test head 12 shown in FIG. 5 from an output terminal 7 via an output terminal 111.

Measurement of noise figure F is performed by controlling a measuring circuit 14 and a processing circuit 15 shown in FIG. 5 by a controlling computer 13, performing on/off controlling to a switch 4 shown in FIG. 1 so as to perform electricity measurement; thus, noise electricity nP and P are measured.

According to noise electricity nP and P as a measurement result obtained via a measuring circuit 14 and a processing circuit 15, a controlling computer 13 can calculate noise figure F according to Formulae 2 and 3.

As above-mentioned, an IC tester according to the present invention can measure noise figure of an IC tester in a position of a DUT 17 to be analyzed on an evaluation board 16 quantitatively and measure signal versus noise level property of an IC tester in a position of a DUT 17 to be analyzed on an evaluation board 16 accurately and quantitatively.

As above-mentioned, an embodiment according to the present invention has been explained with reference to drawings. Structure of the present invention is not limited to embodiments which is explained here. Structure having design change is within a scope of the present invention as long as such design is consistent with purpose and effect of the present invention.

What is claimed is:

1. A noise evaluation circuit which evaluates noise level of an IC tester which measures optical and operative property of a DUT to be evaluated, comprising:

a reference resistor which generates thermal noise;

a reference noise generator which generates reference noise electricity which is calibrated;

a summing circuit which adds the electricity of the thermal noise to the reference noise electricity;

an amplifying circuit which amplifies result of the calculation in the summing circuit;

a switch which is disposed between the reference noise generator and the summing circuit; and an evaluation board having the reference resistor, the reference noise generator, the summing circuit, the amplifying circuit, and the switch thereon for evaluating the DUT to be evaluated; wherein two kinds of electricity value which is output by the amplifying circuit by on/off operation of the switch are calculated with noise figure F according to three kinds of electricity value including electricity value such as the reference noise electricity.

2. A noise evaluation circuit for an IC tester according to claim 1 wherein a summing circuit outputs sum of reference noise electricity and electricity of thermal noise to an amplifying circuit when a switch is in on-state and outputs electricity value of only electricity of thermal noise to the amplifying circuit when the switch is in an off-state.

3. A noise evaluation circuit for an IC tester according to claim 1, wherein amplification ratio of an amplifying circuit is determined by an amplified value of summed result of reference noise electricity which is output from an amplifying circuit when a switch is in an on-state and electricity of a thermal noise and an amplified value of only electricity of the thermal noise which is output from the amplifying circuit when the switch is in an off-state, and calculates noise figure F according to the amplification ratio and the reference noise electricity.

4. A noise evaluation circuit for an IC tester according to claim 1, wherein a reference noise generator comprises a resistor and a plurality of amplifiers which amplify thermal noise of the resistor.

5. A noise evaluation circuit for an IC tester according to claim 1, wherein a switch comprises a plurality of switches and outputs output from a plurality of amplifiers via each resistor.

6. A noise evaluation circuit for an IC tester according to claim 1, wherein a summing circuit comprises a WiredOR.

7. A noise evaluation circuit for an IC tester according to claim 1, wherein a reference resistor is disposed near a DUT to be evaluated.

8. A noise evaluation circuit for an IC tester according to claim 1, wherein an amplifying circuit is disposed near a reference resistor.

* * * * *